Jan. 17, 1956 E. O. KEIZER ET AL 2,731,565

OSCILLATOR SYSTEM

Filed Dec. 29, 1951

INVENTORS:
EUGENE O. KEIZER AND
MARLIN G. KROGER
BY Morris A. Rabkin
ATTORNEY

United States Patent Office 2,731,565

Patented Jan. 17, 1956

2,731,565

OSCILLATOR SYSTEM

Eugene O. Keizer and Marlin G. Kroger, Princeton, N. J., assignors to Radio Corporation of America, a corporation of Delaware Application December 29, 1951, Serial No. 264,104

6 Claims. (Cl. 250—36)

This invention relates to oscillators and, in particular, to a dual oscillator system wherein the oscillators are alternately operative.

In existing systems of this type, separate switching circuits are provided to switch the oscillators in and out of operation. Where high-speed electronic switching is desired, a circuit such as a bistable multivibrator or flip-flop is frequently utilized. The use of such additional switching circuits necessitates more complicated circuitry and results in higher equipment cost and greater maintenance difficulties.

It is an object of the present invention to provide a dual oscillator circuit which permits switching of oscillators without additional switching circuits.

A further object of the present invention is to provide an inexpensive dual oscillator system which has two stable, oscillatory states.

Still a further object of the present invention is to provide an improved dual oscillator system the operation of which may be shifted from one oscillator to the other with reliability, at high speed, and with simple circuitry.

The foregoing and other objects of the present invention are accomplished by utilizing two electron discharge tubes. The anodes of the tubes are connected through separate plate load resistors to B+. The grid of each tube is connected to its anode through a first capacitor, a tuned tank circuit and a second capacitor. Each tank circuit comprises an inductor and a capacitor which have such values that the circuits will oscillate at different frequencies. The grid of each tube is also connected through a grid load resistor and through a resistor-capacitor delay network to a common grid bias resistor. With these connections, the first tube and its associated circuit elements makes up a first oscillator and the second tube and its associated elements make up a second oscillator. When the first oscillator is operating, it builds up a negative bias at its grid and across the common biasing resistor of such a value that the second oscillator is cut off. Conduction is switched from the first oscillator circuit to the second oscillator circuit by means of negative triggering pulses which are applied to the common biasing resistor.

The novel features of the invention, as well as the invention itself, both as to its organization and method of operation, will best be understood from the following description, when read in connection with the accompanying drawings in which.

Figure 1:
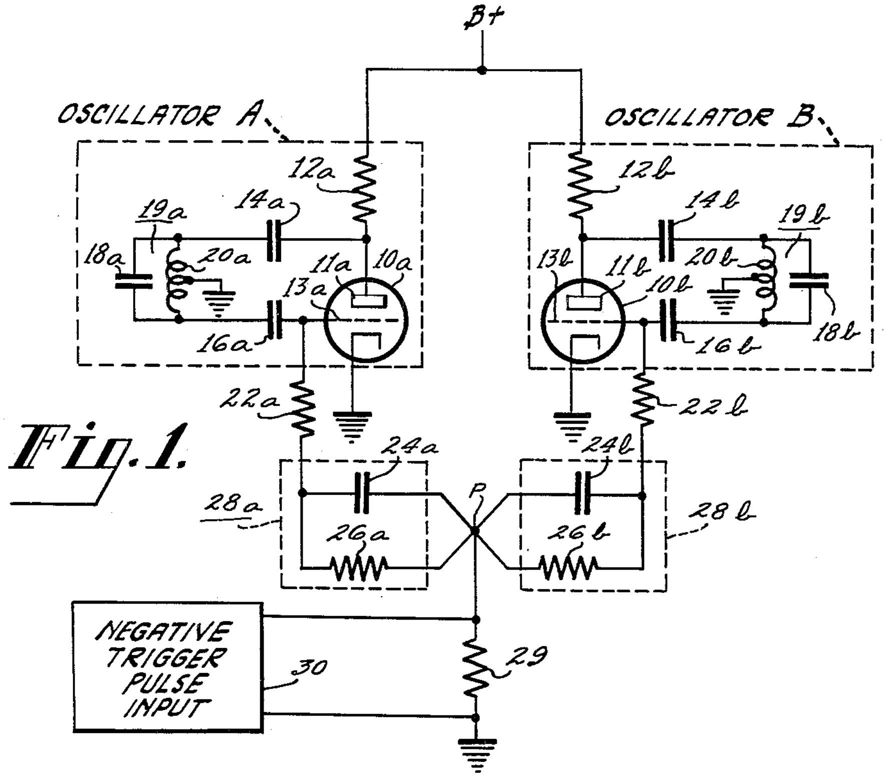
Figure 1 shows a circuit diagram of an embodiment of the invention.

Since the circuit shown in Figure 1 is a symmetrical dual oscillator system, corresponding circuit elements in each half of the system will be given the same number followed by a distinguishing letter. A letter "*a*" will refer to all elements in a first section and the letter "*b*" will refer to elements in the second section. Oscillator circuits A and B are of the Class C Hartley oscillator type, although a Colpitts or Meissner oscillator or any other type could be used, provided that suitable provision is made to insure that it operates as a Class C oscillator. The various types of oscillators which could be used under Class C conditions are shown on page 480, "Radio Engineers' Handbook" by Terman, first edition published by McGraw-Hill Book Company, 1943. Class C operation is required, as will be fully explained below, to provide a negative cut-off bias.

Each oscillator A and B comprises an electron discharge tube 10*a*, 10*b*. The anode 11*a*, 11*b* of each tube 10*a*, 10*b* is connected to B+ through a plate load resistor 12*a*, 12*b*. The tank circuit 19*a*, 19*b* of each oscillator comprises a capacitor 18*a*, 18*b* and an inductor 20*a*, 20*b*. One end of each tank circuit is coupled through a D.-C. blocking capacitor 14*a*, 14*b* to the anode of the related tube. The other end of the tank circuit is connected to the grid 13*a*, 13*b* of the tube through a bias capacitor 16*a*, 16*b*. A tap is made intermediate the ends of each inductor 20*a*, 20*b* and is connected to ground. A grid load resistor 22*a*, 22*b* is connected to each grid. A parallel resistor-capacitor delay network 28*a*, 28*b* is connected to each grid load resistor. A common grid bias resistor 29 is connected to the junction P of the two delay networks. A negative trigger pulse input 30 is provided and is coupled to the ends of the common grid bias resistor 29.

The grid bias of each oscillator has two critical levels. The first of these levels is sufficient to prevent any tank excitation through the tube and consequently causes the termination of any existing oscillation. The second is less negative than the above but still sufficiently negative to prevent initial current flow so that an idle oscillator will be prevented from going into oscillation. Intermediate the two levels above is a range where the grid bias is sufficiently negative to cut off normal flow, while allowing positive peaks from the oscillator tank circuit to cause conduction.

When the first oscillator A is operating, the grid voltage of its tube is in the intermediate range referred to above where the bias is developed by the flow of grid current during the positive peaks of the oscillator tank circuit. The grid current which passes through the grid from the first oscillator tube 10*a* also passes through its grid load resistor 22*a*, the resistor in its delay network 26*a* and the common grid bias resistor 29. The voltage developed thereby across the common grid bias resistor 29, while less than the bias developed at the grid of the first oscillator tube, is sufficiently negative to prevent initial current flow through the second oscillator B. Thus, this second bias across the common grid bias resistor corresponds to the second of the critical bias levels referred to above. As long as the first oscillator remains in operation, the second oscillator is kept idle. In a similar fashion, when second oscillator is operating, it develops a grid bias on the grid of its associated tube and across the common grid bias resistor which is sufficient to prevent operation of the first oscillator.

Figure 2:
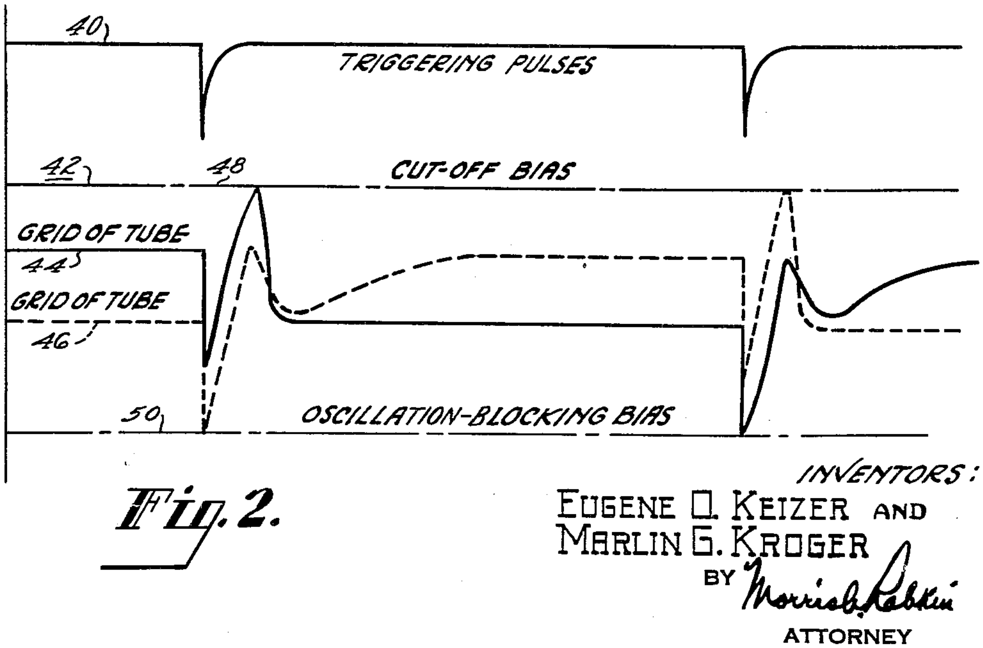
Figure 2 shows the voltage wave forms which occur at various points during the operation of the circuit shown in Figure 1.

The above discussion relates to the steady-state, bistable characteristics of the circuit shown in Figure 1. The triggering or switching operation will now be considered. Let it be assumed that the first oscillator A is in operation. A negative triggering pulse, such as is shown in Figure 2, is applied to the junction P of the first and second delay networks 28a and 28b, and is of sufficient magnitude to cut off the oscillation of the first oscillator. Thus, the bias which appears at the grid of the first oscillator tube 10a at the beginning of the trigger pulse reaches the first critical level referred to above where tank circuit excitation is prevented and oscillation terminated. As a result of the negative triggering pulse, the first oscillator becomes non-conductive and ceases to supply charging current to the bias capacitor 16a connected to the oscillator tube grid. Consequently, the bias capacitor 16a begins to discharge through the grid load resistor 22a, and the common grid biasing resistor 29. The time-constant of the discharge circuit for the bias capacitor is made small relative to the triggering pulse duration such that the negative bias developed across the common grid bias resistor 29 falls rapidly. The bias voltage applied to the second oscillator tube grid through its delay-circuit resistor 26b and grid-load resistor 22b becomes less negative than the cut-off value of the second oscillator tube and allows the initiation of current flow and oscillation through to the second oscillator tube. While the bias capacitor 16a discharges rapidly, the delay circuit capacitor 24a discharges very slowly through the associated delay resistor 26a. Consequently, the negative bias which was developed across the delay resistor during the time when the tube of the first oscillator A was operating is maintained for an additional period after the termination of the triggering pulse at such a value that it prevents resumption of current flow and oscillation in the first oscillator at the termination of the triggering pulse.

It can be seen from the above that there are three actions which tend to cause the switching between oscillators after both oscillator tubes have been cut off by the triggering pulse and after the triggering pulse has terminated.

(1) The discharge of the bias capacitor 16 associated with the first oscillator removes the negative bias applied to the second oscillator tube grid across the common grid bias resistor and allows it to start conducting and oscillation, (2) The charge retained on the delay capacitor 24 keeps the first oscillator tube cut off, and (3) The initiation of oscillation in the second oscillator causes the bias voltage developed across the common grid bias resistor 29 to return to its original value which will maintain the first oscillator cut off after the delay capacitor has discharged.

The circuit can be made to operate without the delay networks if the circuit constants and operating conditions are carefully chosen. This is possible because a previously idle tube always has a smaller negative bias applied to its grid than a previously operating tube, and consequently will recover first after the termination of the negative triggering pulse. However, the reliability of operation is enhanced by the use of the delaying networks.

The voltage wave forms in Figure 2 are provided for a better understanding of the operation described above. Curve 40 shows the negative triggering pulses applied to the common grid bias resistor 29. Curves 42 represent the bias voltages on the grids of the first and second oscillator tubes. The solid line wave form 44 represents the bias on the grid of its first oscillator tube grid. The dotted line wave form 46 represents the bias on the second oscillator tube grid. The dot-dash lines 48, 50 show the two critical bias levels referred to above, namely the cut-off bias 48 and the oscillation-blocking-bias 50.

To insure that the delaying action of the delay networks is sufficient to prevent the last operating oscillator from initiating oscillation after the termination of a cut-off triggering pulse and before oscillation is initiated by the other oscillator, the time-constant of the discharge path of the delay capacitors should be made greater than the duration of the trigger pulse. However, if the oscillators are to be rapidly alternated in operation, then the discharge time-constant of the delay capacitor must be no larger than the time between triggering pulses. It should be noted further that the discharge time-constant of the bias capacitors must be small as compared with the discharge time-constant of the delay capacitors.

In an operative embodiment of the invention, the following values of circuit elements were used:

Tubes 10a and 10b are triode sections of a 12AU7 tube.

| | | |
|---|---|---|
| Resistors **12a** and **12b** | ohms | 4700 |
| Capacitors **14a** and **14b** | μμf | 12 |
| Capacitors **16a** and **16b** | μμf | 12 |
| Capacitors **18a** and **18b** | μμf | 33 |
| Inductor **20a** tuned to | megacycles | 10 |
| Inductor **20b** tuned to | do | 11 |
| Resistors **22a** and **22b** | K | 150 |
| Capacitors **24a** and **24b** | μμf | 220 |
| Resistors **26a** and **26b** | megohms | 1.8 |
| Resistor **28** | do | 10 |
| Battery voltage (B+) | volts | 300 |

From the foregoing description, it will be readily apparent that there has been described and shown herein a simple and inexpensive dual oscillator system, the individual oscillators of which may be switched alternately into operation at a high speed and with reliability.

We claim:

1. A dual oscillator circuit having two stable states comprising, in combination, two oscillators, a separate biasing circuit for each of said oscillators adapted to develop a bias in response to the presence of sustained oscillations, common biasing circuit means connected to said separate biasing circuits for applying thereto a part of said oscillation-sustained bias such that the sustained oscillations of one oscillator prevents oscillation in the other, means for applying trigger pulses to said common biasing circuit of sufficient magnitude to cut off all oscillations, and means including a bias delay network for retaining a part of said oscillation-sustained bias on a previously operating oscillator after the cessation of its oscillation such that a previously operating oscillator is prevented from becoming operative for a predetermined period after the termination of a trigger pulse, whereby the stable state of said dual oscillator circuit is alternately changed in response to said trigger pulses.

2. A dual oscillator circuit as recited in claim 1 wherein each of said oscillators includes an electron discharge tube having at least a cathode, an anode, and a control grid, and a tuned tank circuit having an inductor and a capacitor.

3. A dual oscillator circuit as recited in claim 2 wherein each of said separate biasing circuits for each oscillator comprises a bais capacitor which is connected between the grid of each tube and its associated tank circuit, and a grid load resistor which is connected to the grid of said tube.

4. A dual oscillator circuit as recited in claim 3 wherein said common biasing circuit includes a common bias resistor, and wherein said delay network includes a resistor and a capacitor connected in parallel, a first junction of said first resistor and said capacitor network being connected to said grid load resistor and a second junction of said resistor and capacitor being connected to said common bias resistor.

5. A dual oscillator circuit having two stable states comprising a first and a second electron discharge tube each having at least a cathode, an anode, a control grid, and a circuit connecting said plate to said control grid, means including a separate, tuned, tank circuit in said circuit connecting said plate to said control grid, for determining the frequency of oscillation through said tubes, separate biasing networks connected to the grid of each tube each including a capacitor and a grid load resistor, a common bias resistor, a separate bias delay network for each tube including a resistor and a capacitor connected in parallel, said delay network connecting said grid resistor to said common bias resistor, means for applying trigger pulses to said common biasing resistor of a magnitude and polarity such that oscillation is cut off in both tubes.

6. In combination, a first and a second electron discharge tube each having at least an anode, a cathode, and a control grid, separate means connected between the anode and grid of each tube for establishing oscillations, a separate bias circuit connected to the grid of each tube and adapted to develop a bias in response to the presence of sustained oscillations, said separate biasing circuits each including a capacitor and a grid load resistor, a common biasing circuit means connected to said separate biasing circuits and adapted to apply a fraction of the bias from one of said separate bias circuits connected to the grid of one of said tubes which is in oscillation to the control grid of the other tube such that the oscillation through said one tube prevents conduction and oscillation through the other, means for applying trigger pulses to said common biasing circuit of a magnitude and polarity such that conduction and oscillation is prevented in both tubes, a bias delay network for each tube including a resistor and a capacitor connected in parallel, said bias delay network being connected to said grid bias resistors and to said common biasing circuit.

References Cited in the file of this patent

UNITED STATES PATENTS

| | | |
|---|---|---|
| 2,150,241 | Nichols | Mar. 14, 1939 |
| 2,279,319 | Honaman | Apr. 14, 1942 |
| 2,445,448 | Miller | July 20, 1948 |
| 2,448,336 | Weiner | Aug. 31, 1948 |